(12) United States Patent
Nehrig et al.

(10) Patent No.: US 7,663,379 B2
(45) Date of Patent: Feb. 16, 2010

(54) CAPACITANCE-TO-VOLTAGE CONVERSION METHOD AND APPARATUS

(75) Inventors: Oliver Nehrig, Kirchdorf (DE); Rudiger Ganz, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 773 days.

(21) Appl. No.: 11/425,013

(22) Filed: Jun. 19, 2006

(65) Prior Publication Data

US 2006/0284603 A1    Dec. 21, 2006

(30) Foreign Application Priority Data

Jun. 17, 2005    (DE) ..................... 10 2005 028 507

(51) Int. Cl.
*G01R 27/26* (2006.01)
*H03K 5/01* (2006.01)

(52) U.S. Cl. ......................... 324/678; 324/679; 327/100
(58) Field of Classification Search ................. 324/678, 324/679
See application file for complete search history.

(56) References Cited

U.S. PATENT DOCUMENTS

| | | | | |
|---|---|---|---|---|
| 4,404,481 A | * | 9/1983 | Ide et al. | 327/100 |
| 6,377,056 B1 | * | 4/2002 | Hanzawa et al. | 324/678 |
| 6,529,015 B2 | * | 3/2003 | Nonoyama et al. | 324/678 |
| 2003/0062905 A1 | * | 4/2003 | Kollmer et al. | 324/534 |

FOREIGN PATENT DOCUMENTS

| | | |
|---|---|---|
| DE | 28 19 516 A1 | 11/1978 |
| DE | 101 09 873 A1 | 9/2001 |
| DE | 10 2004 052034 A1 | 6/2005 |

OTHER PUBLICATIONS

J. Phys. E: Sci. Instrum 21 (1988) 242-250.
IEEE Transaction on Instrumentation and Measurement, vol. IM-35, No. 4, Dec. 1986, S. 472-476.

(Continued)

*Primary Examiner*—Jeff Natalini
(74) *Attorney, Agent, or Firm*—William B. Kempler; Wade J. Brady, III; Frederick J. Telecky, Jr.

(57) ABSTRACT

A method of capacitance-to-voltage conversion with an external sensor capacitor ($C_P$) and a capacitance-to-voltage converter (14) implemented on an integrated readout circuit that includes a reference capacitor ($C_R$), a sampling capacitor ($C_S$) and a sampling amplifier (22) and which has input terminals (16) to which the sensor capacitor ($C_P$) is connected. The method comprises the steps of a) applying a reference voltage ($V_{ref}$) to the series connected sensor capacitor ($C_P$) and reference capacitor ($C_R$) and charging the sampling capacitor ($C_S$) to the potential at the interconnection node (A) between the sensor capacitor ($C_P$) and the reference capacitor ($C_R$), b) connecting the sampling capacitor ($C_S$) to inputs of the sampling amplifier. The method further comprises the steps of c) applying the reference voltage ($V_{ref}$) to the series connected sensor capacitor ($C_P$) and reference capacitor ($C_R$) with a polarity opposite to that in step a) and charging the sampling capacitor ($C_S$) to the potential at the interconnection node (A) between the sensor capacitor ($C_P$) and the reference capacitor ($C_R$) and d) connecting the sampling capacitor ($C_S$) to the inputs of the sampling amplifier in a polarity opposite to that in step b).

10 Claims, 3 Drawing Sheets

OTHER PUBLICATIONS

IEEE Transactions on Instrumentation and Measurement, vol. 38, No. 3, Jun. 1989, S 736-739.
IEEE Transactions on Instrumentation and Measurement, vol. 47, No. 1, Feb. 1998, S. 16-20.
IEEE Transactions on Instrumentation and Measurement, vol. 47, No. 1, Feb. 1998, S. 285-288.
IEEE Transactions on Instrumentation and Measurement, vol. 45, No. 2, Apr. 1996, S 531-540.

* cited by examiner

CAPACITANCE-TO-VOLTAGE CONVERSION METHOD AND APPARATUS

The invention relates to a method of capacitance-to-voltage conversion with an external sensor capacitor and a capacitance-to-voltage converter implemented on an integrated readout circuit that includes a reference capacitor, a sampling capacitor and a sampling amplifier and which has input terminals to which the sensor capacitor is connected. The invention further relates to a capacitance-to-voltage converter implemented on an integrated readout circuit for reading out an external sensor capacitor and including a reference capacitor, a sampling capacitor and a sampling amplifier and input terminals to which the sensor capacitor is connected. The invention further relates to a tire pressure monitoring automotive system, including for each tire to be monitored a pressure sensor with a sensor capacitor and a capacitance-to-voltage converter.

BACKGROUND

Capacitor-to-voltage converters are needed in applications which use a capacitive sensor element. These applications include tire pressure measurement systems, acceleration measurement systems or others. These systems usually include an external capacitive sensor which is outside an integrated circuit that includes readout circuitry. The capacitance of the capacitive sensor changes, for example, with pressure. For further processing, such as digitizing with an analog-to-digital converter, this capacitance is changed into a capacitance dependent voltage by a capacitance-to-voltage converter.

Usually, the capacitive sensor element and the readout circuitry are assembled together on a printed circuit board. One requirement is that the input pins of the readout circuitry must withstand electrostatic discharges, for example, with voltages up to 2 kV according to the human body model. This protection is achieved by ESD (electrostatic discharge) protection circuits. Unfortunately, these ESD protection circuits cause substrate leakage currents which increase with temperature. In an automotive environment, the temperature ranges up to 125° Celsius. At this high temperature, conventional ESD protection circuits lead to a leakage current of typically 50 nA. This leakage current falsifies the readout of the capacitance; thus, falsifying the voltage to be digitized. Especially, the temperature dependency of the leakage causes problems.

One approach to increase the precision of capacitance measurement is to minimize the leakage current. Therefore, the use of special ESD protection circuits is necessary, but this leads to an increase of costs of the integrated readout circuitry and reduced ESD protection performance. Furthermore, leakage currents may also occur independent of the ESD protection circuit due to dirt or humidity on the printed circuit board or due to assembly problems, as well as due to chip internal resistive elements.

Therefore, there is a need for a method of capacitance-to-voltage conversion which cancels out the effect of any leakage currents, even when using standard ESD protection circuits.

SUMMARY

The invention provides a method of capacitance-to-voltage conversion with an external sensor capacitor and a capacitance-to-voltage converter implemented on an integrated readout circuit that includes a reference capacitor, a sampling capacitor and a sampling amplifier which cancels out any leakage currents. The integrated readout circuit has input terminals to which the sensor capacitor is connected. The method comprises the steps of: a) applying a reference voltage to the series connected sensor capacitor and reference capacitor, and charging the sampling capacitor to the potential at the interconnection node between the sensor capacitor and the reference capacitor; b) connecting the sampling capacitor to inputs of the sampling amplifier; and c) applying the reference voltage to the series connected sensor capacitor and reference capacitor with a polarity opposite to that in the step a); whereby the sampling capacitor is charged to the potential at the interconnection node between the sensor capacitor and the reference capacitor and, in a step d), the sampling capacitor is connected to the inputs of the sampling amplifier in a polarity opposite to that in step b).

Thus, the reference voltage is applied twice to the series connected sensor capacitor and reference capacitor but with opposite polarity. The sampling capacitor is also charged twice and connected twice to the sampling amplifier, also with opposite polarity. As a result, any contribution to the measured voltage due to leakage current is cancelled out. In a preferred embodiment these alternating steps are repeated multiple times. Applying the steps a) to d) multiple times improves the leakage cancellation effect by averaging out a jitter of the sampling time.

A problem encountered when reading out a cheap capacitive sensor with simply two terminals is to deliver a differential output voltage which is necessary for insensitivity to power supply and ground noise. In a preferred embodiment the sampling capacitor is connected to differential inputs of the sampling amplifier and a differential output voltage is generated by the sampling amplifier. Preferably the sampling capacitor is connected floating so that no precise common mode regulation is needed. So a precise measurement is possible in a cost effective way, delivering a differential output voltage. A differential approach of the processing circuit is necessary for a signal to noise ratio of 50 dB or better.

The invention further provides a capacitance-to-voltage converter implemented on an integrated readout circuit for reading out an external sensor capacitor and including a reference capacitor, a sampling capacitor and a sampling amplifier and which has input terminals to which the sensor capacitor is connected, further comprising a switching arrangement for selectively a) connecting the series connected sensor capacitor and reference capacitor to a reference voltage source and connecting the sampling capacitor to the interconnection node between the sensor capacitor and the reference capacitor. The switching arrangement allows to b) connect the sampling capacitor to inputs of the sampling amplifier and then c) to connect the series connected sensor capacitor and reference capacitor to the reference voltage source with a polarity opposite to that in feature a) and to connect the sampling capacitor to the interconnection node between the sensor capacitor and the reference capacitor and further allows d) connecting the sampling capacitor to the inputs of the sampling amplifier with a polarity opposite to that in feature b).

Preferably the sampling amplifier has differential in- and outputs, thus being insensitive for power supply and ground noise. In a preferred embodiment each output of the sampling amplifier is looped back to a different one of the differential inputs by a feedback capacitor.

The invention further provides a tire pressure monitoring automotive system including for each tire to be monitored a pressure sensor with a sensor capacitor and an inventive capacitance-to-voltage converter.

BRIEF DESCRIPTION OF THE DRAWINGS

Example embodiments are described below with reference to accompanying drawings, wherein:

FIG. 1 shows schematically a capacitance-to-voltage converter with a capacitive sensor connected to;

DETAILED DESCRIPTION OF THE EMBODIMENTS

Figure 1:
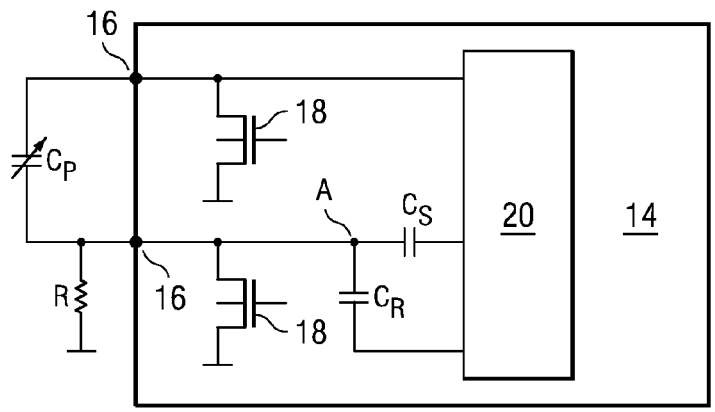

FIG. 1 shows schematically an inventive capacitance-to-voltage converter 14 and a sensor capacitor $C_P$ connected thereto at input terminals 16. The capacitance-to-voltage converter 14 is implemented on an integrated readout circuit. Sensor capacitor $C_P$ and the capacitance-to-voltage converter 14 are usually mounted together on a circuit board. The integrated readout circuit includes two ESD protection circuits 18 which are connected between the input terminals 16 and ground, a sampling capacitor $C_S$, a reference capacitor $C_R$ and further readout circuitry 20. A resistor R which is shown to be connected between one of the input terminals 16 and ground is a parasitic resistor which may be formed e.g. by dirt or humidity on the circuit board. The readout circuitry 20 includes a sampling amplifier and reference voltage sources which are not shown in FIG. 1. The two ESD protection circuits 18 protect readout circuitry 20 from electrostatic discharges. One of the input terminals 16 is connected directly to the readout circuitry 20 while the other input terminal is connected to an interconnection node A which interconnects the sampling capacitor $C_S$ and the reference capacitor $C_R$. Both capacitors $C_S$ and $C_R$ are connected with their other plate to the readout circuitry 20. In operation, there is a leakage current passing through the ESD protection circuits 18 and also through the parasitic resistor R.

Figure 2A:
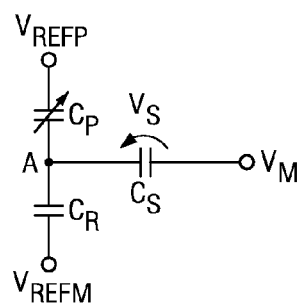
FIG. 2a shows schematically the interconnection of a sensor capacitor, a reference capacitor and a sampling capacitor in a first sample phase.

The inventive method of capacitance-to-voltage conversion will now be explained in more detail with reference to FIGS. 2a to 4b. FIG. 2a shows the interconnection of the sensor capacitor $C_P$, the reference capacitor $C_R$ and the sampling capacitor $C_S$ in a first sample phase. Sensor capacitor $C_P$ and reference capacitor $C_R$ are connected in series with each other. One plate of sensor capacitor $C_P$ is connected to a voltage potential $V_{refp}$ while one plate of reference capacitor $C_R$ is connected to a potential $V_{refm}$. Thus, a reference voltage $V_{ref}=V_{refp}-V_{refm}$ is divided by a capacitive voltage divider which is formed by the two capacitors $C_P$, $C_R$. The voltage at interconnection node A depends on the ratio between the capacitances of the reference capacitor $C_R$ and the sensor capacitor $C_P$. As the capacitance of reference capacitor $C_R$ is constant, the voltage at interconnection node A varies with the capacitance change of sensor capacitor $C_P$. In the sample phase the sampling capacitor $C_S$ is connected between the interconnection node A and a potential $V_m$, so that the sampling capacitor $C_S$ is charged depending on the potential at the interconnection node A. The charge $Q_S$ stored on $C_S$ is defined by:

$$Q_S = V_S \cdot C_S \text{ where } V_S \text{ is the voltage drop over sampling capacitor } C_S,$$

$$= C_S \cdot \frac{V_m \cdot (C_R + C_P) - V_{ref} \cdot C_P}{C_P + C_R + C_S}, \text{ with } V_{ref} = V_{refp} - V_{refm}.$$

Figure 2B:
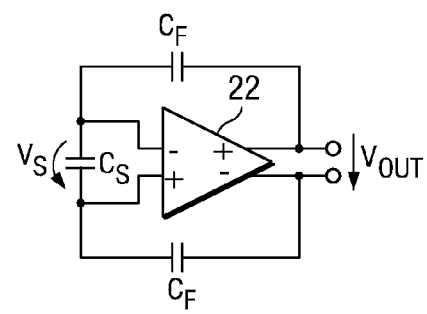
FIG. 2b shows schematically the connection of the sampling capacitor to a sampling amplifier in a first transfer phase.

FIG. 2b shows the transfer phase which follows the first sample phase when the sampling capacitor $C_S$ is charged. The sampling capacitor $C_S$ is connected to differential inputs of a sampling amplifier 22, which is included on the integrated readout circuitry 20. In the transfer phase the charge on sampling capacitor $C_S$ is transferred to the sampling amplifier. On the differential output terminals of sampling amplifier 22 appears an output voltage $V_{out}$. Each output of the sampling amplifier 22 is looped back to a different one of the differential inputs by a feedback capacitor $C_f$. The output voltage $V_{out}$ of the sampling amplifier 22 is proportional to the charge stored on sampling capacitor $C_S$. The output voltage $V_{out}$ is defined to:

$$V_{out} = 2 \cdot \frac{Q_s}{C_f}.$$

Figure 3:
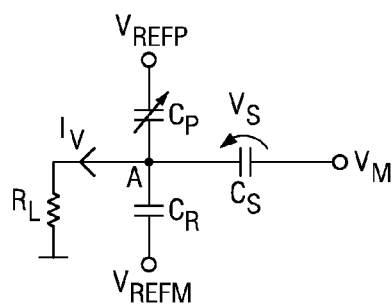
FIG. 3 shows schematically the influence of a leakage current in a sample phase.

So far, the sampling and transfer phases have been discussed for ideal circuitry. But the sensor capacitor $C_P$ is external to the integrated readout circuit and there are leakage currents. Leakage occurs at both plates of sensor capacitor $C_P$ but relevant is only the leakage at the high impedance interconnection node A. FIG. 3 symbolizes the leakage by a leakage resistor $R_L$ through which a leakage current $I_V$ passes. $I_V$ is the leakage current which occurs through the ESD protection circuit and through parasitic resistor R shown in FIG. 1. Thus, the charge $Q_S$ which is stored on sampling capacitor $C_S$ is decreased by a charge $\Delta Q$ which is transferred by the leakage current $I_V$ to ground during the sample phase. When taking this leakage current into consideration the charge $Q_S$ stored on the sampling capacitor $C_S$ at the end of the sample phase is:

$$Q_S = V_S \cdot C_S - I_V \cdot t \text{ with } I_V \cdot t = \Delta Q;$$

$$= C_S \cdot \frac{V_m \cdot (C_R + C_P) - V_{ref} \cdot C_P}{C_P + C_R + C_S} - \Delta Q, \text{ with } V_{ref} = V_{refp} - V_{refm}.$$

This leakage current leads to the aforementioned measurement errors.

Figure 4A:
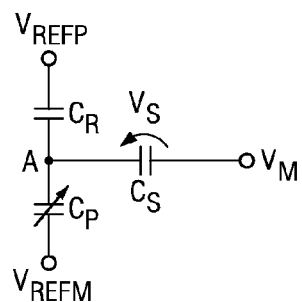
FIG. 4a shows schematically the interconnection of a sensor capacitor, a reference capacitor and a sampling capacitor in a second sample phase.
Figure 4B:
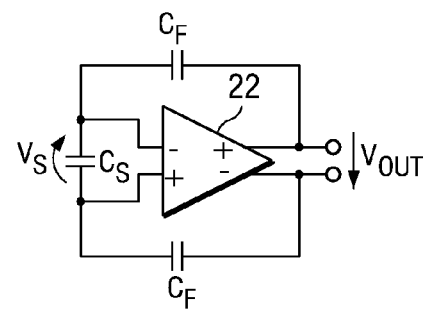
FIG. 4b shows schematically the connection of the sampling capacitor to the sampling amplifier in a second transfer phase.

In the inventive method the capacitive voltage divider is switched on a second time but with a different polarity to cancel out the effect of the leakage current. FIG. 4a shows the capacitors' configuration during the second sample phase. Sensor capacitor $C_P$ and reference capacitor $C_R$ are interconnected at interconnection node A. They are connected in series but contrary to sample phase 1 reference capacitor $C_R$ is now connected to the potential $V_{ref}$ while sensor capacitor $C_P$ is now connected to the voltage potential $V_{refm}$. As in the first sample phase sampling capacitor $C_S$ is connected between the interconnection node A and potential $V_m$ and charged. The leakage current $I_V$ shown in FIG. 3 always flows to chip ground. As the polarity of the reference voltage is inversed during the second sample phase compared to the first sample phase, the voltage $V_S$ over sampling capacitor $C_S$ also changes polarity while the leakage current $I_V$ does not. FIG. 4b shows the second transfer phase. The plate of sampling capacitor $C_S$ which was in the first transfer phase connected to the negative input terminal of sampling amplifier 22 is now connected to the positive input terminal of sampling amplifier 22. Thus, the sampling capacitor $C_S$ is connected to the inputs of the sampling amplifier 22 with a polarity opposite to this in transfer phase 1. Therefore, the polarity change effectuated in the sample phase is compensated. As the charge in the feedback capacitors $C_f$ is preserved over the two transfer phases, the output voltages of the two transfer phases are averaged which cancels out the effect of the leakage current $I_V$. Connecting the sampling capacitor $C_S$ floating to the differential inputs of the amplifier during the transfer phases has the advantage that no precise common mode regulation for the fully differential amplifier is needed. This allows a cheaper implementation of this fully differential amplifier.

Regarding the two sampling and the two transfer phases together leads to the following calculation which demonstrates that the effect of the leakage current $I_V$, is cancelled out.

During the first sample phase, the charge is:

$$Q_S^I = C_S \cdot \frac{V_m \cdot (C_R + C_P) - V_{ref} \cdot C_P}{C_P + C_R + C_S} - \Delta Q^I$$

charge during sample phase I.

In the second sample phase, the polarity is changed, so the charge is:

$$Q_S^{II} = C_S \cdot \frac{V_m \cdot (C_R + C_P) - V_{ref} \cdot C_R}{C_P + C_R + C_S} - \Delta Q^{II}$$

charge during sample phase I.

As the feedback capacitors $C_f$ preserve the charge collected during the first transfer phase there is an output voltage at the output terminals of sampling amplifier 22 which is an addition of the output voltages of the two transfer phases:

$$V_{out} = 2 \cdot \frac{Q_S^I - Q_S^{II}}{C_f}.$$

$$V_{out} = \frac{2}{C_f} \cdot \left( C_S \cdot \frac{V_m \cdot (C_R + C_P) - V_{ref} \cdot C_P}{C_P + C_R + C_S} - \Delta Q^I - C_S \cdot \frac{V_m \cdot (C_R + C_P) - V_{ref} \cdot C_R}{C_P + C_R + C_S} + \Delta Q^{II} \right);$$

and with $\Delta Q^I \approx \Delta Q^{II}$, which is true for approximately same sampling times and unchanged leakage current, the output voltage is:

$$V_{out} = 2 \cdot \frac{C_S}{C_f} \cdot \left( \frac{V_m \cdot (C_R + C_P) - V_{ref} \cdot C_P - V_m \cdot (C_R + C_P) + V_{ref} \cdot C_R}{C_P + C_R + C_S} \right);$$

-continued $$V_{out} = 2 \cdot \frac{C_S}{C_f} \cdot \left( \frac{V_{ref} \cdot C_R - V_{ref} \cdot C_P}{C_P + C_R + C_S} \right) = 2 \cdot V_{ref} \cdot \frac{C_S}{C_f} \cdot \left( \frac{C_R - C_P}{C_P + C_R + C_S} \right).$$

The effect of leakage current is cancelled out; the output voltage only depends on the applied reference voltage $V_{ref}$ and the values of the capacitances of the sampling capacitor $C_S$, reference capacitor $C_R$, sensor capacitor $C_P$ and feedback capacitors $C_f$.

Figure 5:
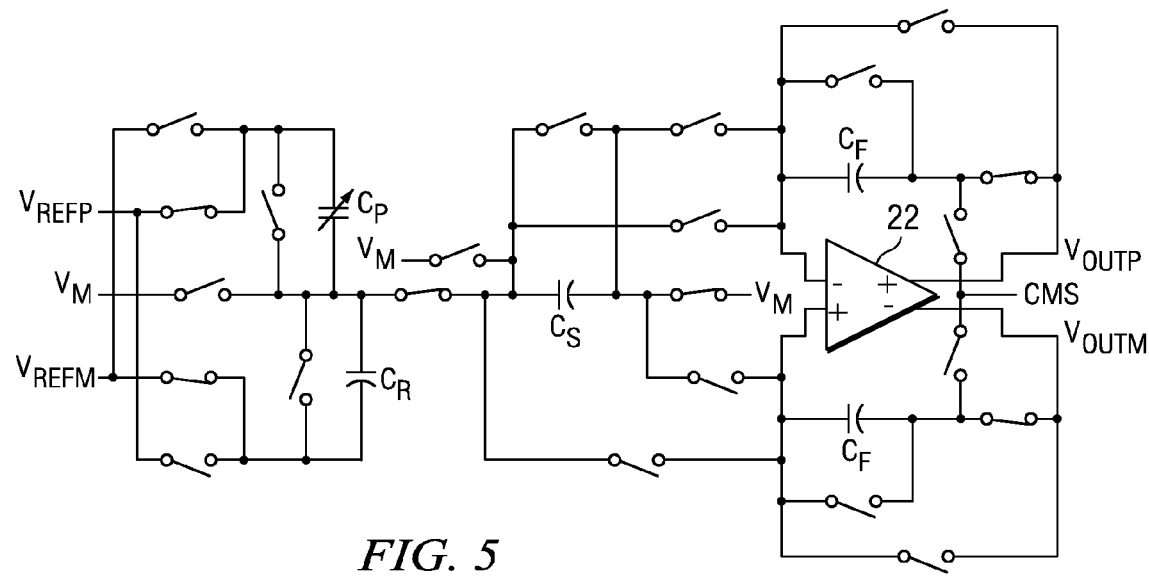
FIGS. 5 to 8 show the preferred embodiment of the inventive capacitance-to-voltage converter with the switching arrangement in a state for a first sample phase, a first transfer phase, a second sample phase and a second transfer phase.
Figure 6:
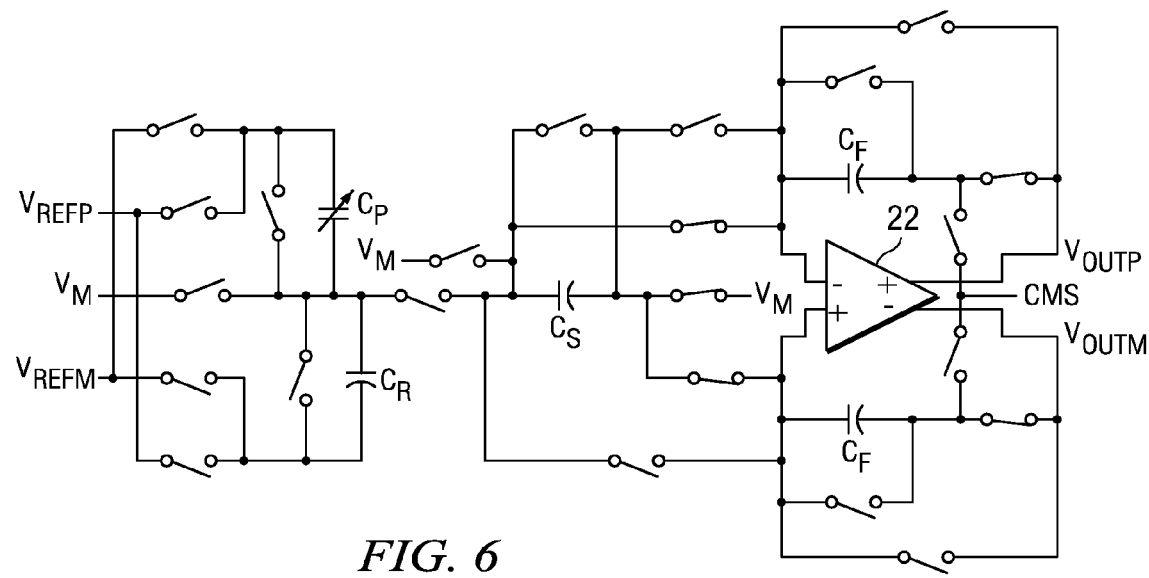
Figure 7:
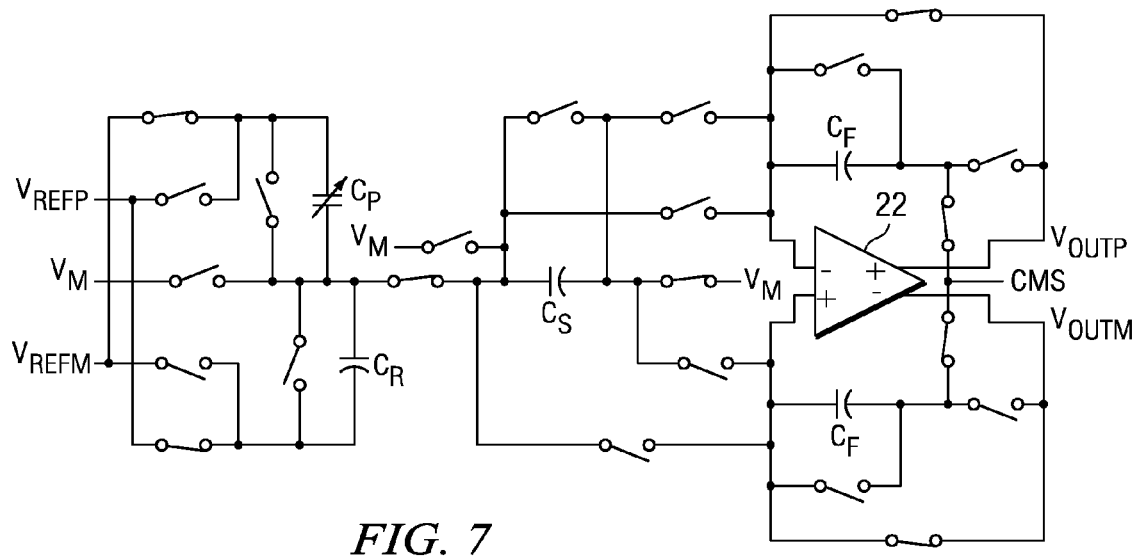
Figure 8:
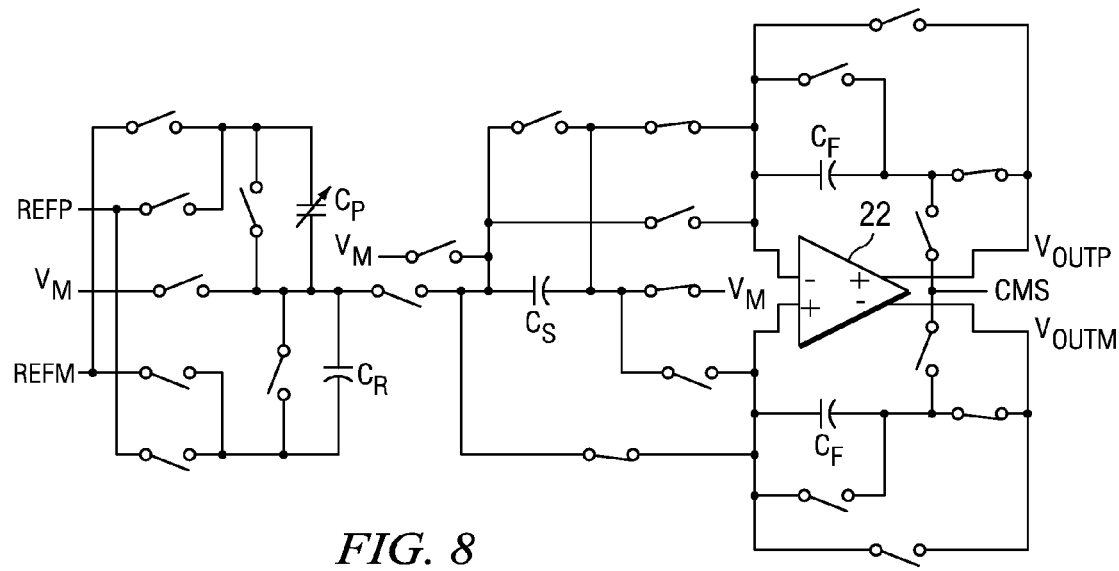

FIGS. 5 to 8 show a realization in a preferred embodiment. Voltages $V_{refp}$, $V_{refm}$ and $V_m$ are applied to the circuit and a differential output voltage $V_{outp}$, $V_{outm}$ is output. Included are a sampling capacitor $C_S$, a reference capacitor $C_R$, a sensor capacitor $C_P$ and feedback capacitors $C_f$ as well as a sampling amplifier 22 and a switching arrangement with a plurality of switches which allow change between the different phases. FIG. 5 shows a capacitance-to-voltage converter in a state for the first sample phase. The sampling capacitor $C_S$ is connected to an interconnection node of reference capacitor $C_R$ and sensor capacitor $C_S$. FIG. 6 shows the capacitance-to-voltage converter in a state for the first transfer phase, the sampling capacitor $C_S$ is now disconnected from capacitors $C_R$, $C_P$ and connected to the input terminals of sampling amplifier 22. FIG. 7 shows the capacitance-to-voltage converter in a state for the second sample phase. Compared to the state in FIG. 5 the reference voltage is inversed, sensor capacitor $C_P$ is now connected to $V_{refp}$, and reference capacitor $C_R$ is now connected to $V_{refp}$. FIG. 8 shows the capacitance-to-voltage converter in a state for the second transfer phase. Compared to the state shown in FIG. 6 the polarity of the sampling capacitor $C_S$ on the input terminals of sampling amplifier 22 is inversed.

The described inventive capacitance-to-voltage converter delivers a precise measurement even when using a cheap sensor capacitor and with temperatures up to 125° C. Therefore it is advantageously used in a tire pressure monitoring system with a sensor capacitor in a range of about 5 to 20 pF and a capacitance-to-voltage converter for each tire.

Those skilled in the art to which the invention relates will appreciate that various additions, deletions, substitutions and other modifications may be made to the described example embodiments, without departing from the scope of the claimed invention.

The invention claimed is:

1. A method of capacitance-to-voltage conversion with an external sensor capacitor and a capacitance-to-voltage converter implemented on an integrated readout circuit that includes a reference capacitor, a sampling capacitor and a sampling amplifier and has input terminals to which the sensor capacitor is connected to be in series with the reference capacitor, comprising the steps of:

a) applying a reference voltage to the series connected sensor capacitor and reference capacitor, and charging the sampling capacitor to the potential at an interconnection node between the sensor capacitor and the reference capacitor;

b) connecting the sampling capacitor to inputs of the sampling amplifier;

c) applying the reference voltage to the series connected sensor capacitor and reference capacitor with a polarity opposite to that in step a), and charging the sampling capacitor to the potential at the interconnection node between the sensor capacitor and the reference capacitor; and d) connecting the sampling capacitor to the inputs of the sampling amplifier in a polarity opposite to that in step b).

2. The method of claim 1, wherein steps a) to d) are repeated multiple times.

3. The method of claim 1, wherein the sampling capacitor is connected in steps b) and d) to differential inputs of the sampling amplifier, and a differential output is generated by the sampling amplifier.

4. A capacitance-to-voltage converter implemented on an integrated readout circuit for reading out an external sensor capacitor; comprising:
  a reference capacitor;
  a sampling capacitor;
  a sampling amplifier and which has input terminals to which the sensor capacitor is connected to be in series with the reference capacitor; and
  a switching arrangement for selectively:
    a) connecting the series connected sensor capacitor and reference capacitor to a reference voltage source and connecting the sampling capacitor to an interconnection node between the sensor capacitor and the reference capacitor;
    b) connecting the sampling capacitor to inputs of the sampling amplifier;
    c) connecting the series connected sensor capacitor and reference capacitor to the reference voltage source with a polarity opposite to that in feature a) and connecting the sampling capacitor to the interconnection node between the sensor capacitor and the reference capacitor; and
    d) connecting the sampling capacitor to the inputs of the sampling amplifier with a polarity opposite to that in feature b).

5. The capacitance-to-voltage converter of claim 4, wherein the sampling amplifier has differential inputs.

6. The capacitance-to-voltage converter of claim 5, wherein each output of the sampling amplifier is looped back to a different one of the differential inputs by a feedback capacitor.

7. The capacitance-to-voltage converter of claim 4, wherein the integrated readout circuit includes ESD protection circuits associated with the input terminals.

8. The capacitance-to-voltage converter of claim 4, wherein the sensor capacitor is associated with a pneumatic pressure sensor.

9. The capacitance-to-voltage converter of claim 4, wherein the sensor capacitor is associated with an acceleration sensor.

10. The converter of claim 4, in a tire pressure monitoring automotive system including for each tire to be monitored a pressure sensor with a sensor capacitor and a capacitance-to-voltage converter according to claim 4.

* * * * *

UNITED STATES PATENT AND TRADEMARK OFFICE
CERTIFICATE OF CORRECTION

PATENT NO. : 7,663,379 B2  
APPLICATION NO. : 11/425013  
DATED : February 16, 2010  
INVENTOR(S) : Oliver Nehrig and Ruediger Ganz Page 1 of 1

It is certified that error appears in the above-identified patent and that said Letters Patent is hereby corrected as shown below:

Title Page, Item (75) Inventor,  
Please correct inventor's name "Rudiger Ganz" to reflect --Ruediger Ganz--.

Signed and Sealed this

Twentieth Day of July, 2010

David J. Kappos  
*Director of the United States Patent and Trademark Office*

UNITED STATES PATENT AND TRADEMARK OFFICE
CERTIFICATE OF CORRECTION

PATENT NO. : 7,663,379 B2 Page 1 of 1
APPLICATION NO. : 11/425013
DATED : February 16, 2010
INVENTOR(S) : Nehrig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 912 days.

Signed and Sealed this

Twenty-eighth Day of December, 2010

David J. Kappos
*Director of the United States Patent and Trademark Office*